(12) United States Patent  (10) Patent No.: US 10,914,642 B2
Zhao et al. (45) Date of Patent: Feb. 9, 2021

(54) DEVICE FOR TEMPERATURE DETECTION

(71) Applicant: BOE TECHNOLOGY GROUP CO., LTD., Beijing (CN)

(72) Inventors: Lijun Zhao, Beijing (CN); Haisheng Wang, Beijing (CN); Yingming Liu, Beijing (CN); Rui Xu, Beijing (CN); Changfeng Li, Beijing (CN); Yanan Jia, Beijing (CN); Pengpeng Wang, Beijing (CN); Chih Jen Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 228 days.

(21) Appl. No.: 15/999,745

(22) PCT Filed: Jan. 2, 2018

(86) PCT No.: PCT/CN2018/070036
§ 371 (c)(1),
(2) Date: Aug. 20, 2018

(87) PCT Pub. No.: WO2018/218964
PCT Pub. Date: Dec. 6, 2018

(65) Prior Publication Data
US 2019/0376849 A1 Dec. 12, 2019

(30) Foreign Application Priority Data
Jun. 2, 2017 (CN) .......................... 2017 1 0407940

(51) Int. Cl.
G01K 7/00 (2006.01)
G01K 7/01 (2006.01)
(Continued)

(52) U.S. Cl.
CPC .......... *G01K 7/015* (2013.01); *H01L 27/1255* (2013.01); *H01L 29/24* (2013.01);
(Continued)

(58) Field of Classification Search
USPC ..................................... 331/57, 176
See application file for complete search history.

(56) References Cited

U.S. PATENT DOCUMENTS 7,215,212 B2  5/2007  Mahony et al.
2005/0195010 A1* 9/2005 Confalonieri .......... H03H 11/26
                                                    327/277
(Continued)

FOREIGN PATENT DOCUMENTS

CN  101592528 A  12/2009
CN  101681927 A  3/2010
(Continued)

OTHER PUBLICATIONS

PCT International Search Report, Application No. PCT/CN2018/070036, dated Mar. 28, 2018, 8 pages: with English translation.
(Continued)

*Primary Examiner* — Stephen D Meier
*Assistant Examiner* — Nasir U. Ahmed
(74) *Attorney, Agent, or Firm* — Armstrong Teasdale LLP

(57) ABSTRACT

The embodiments of the present disclosure relate to a device for temperature detection, including a delay unit including an odd number of inverters coupled end to end, a switching transistor having a control electrode coupled to an output end of the delay unit, a first electrode coupled to an operating voltage node of the device, and a second electrode coupled to an input end of the delay unit, a first capacitor having a first end coupled to the input end of the delay unit, and a second end coupled to the first electrode of the switching transistor or a ground node of the device, and a temperature (Continued)

sensitive transistor having a control electrode coupled to a bias voltage end of the device, a first electrode coupled to the input end of the delay unit, and a second electrode coupled to the ground node of the device.

12 Claims, 5 Drawing Sheets

(51) Int. Cl.
    *H03K 5/134*     (2014.01)
    *H01L 27/12*     (2006.01)
    *H01L 29/24*     (2006.01)
    *H01L 29/786*     (2006.01)
    *H03K 5/00*     (2006.01)

(52) U.S. Cl.
    CPC .... *H01L 29/7869* (2013.01); *H01L 29/78672* (2013.01); *H03K 5/134* (2014.07); *H03K 2005/00078* (2013.01); *H03K 2005/00195* (2013.01)

(56) References Cited

U.S. PATENT DOCUMENTS

2008/0143449 A1*   6/2008   Chung .................... G01K 7/01
                                                                        331/66
2010/0066434 A1*   3/2010   Liao ....................... G05F 3/245
                                                                        327/513
2010/0085081 A1*   4/2010   Ofuji .................. H01L 27/1233
                                                                        326/102

FOREIGN PATENT DOCUMENTS

| CN | 102289705 A | 12/2011 |
| CN | 106023890 A | 10/2016 |
| CN | 107219014 A | 9/2017 |
| JP | 6032131 B2 | 11/2016 |

OTHER PUBLICATIONS

PCT Written Opinion, Application No. PCT/CN2018/070036, dated Mar. 28, 2018, 9 pages.: with English translation of relevant part.
China First Office Action, Application No. 201710407940.6, dated Apr. 23, 2018, 22 pps.: with English translation.
"Switch Circuit", Editorial Board of the Electronic Industry Production Technical Manual, Electronic Industry Production Technology Handbook (8), Semiconductor and Integrated Circuit Volume, May 31, 1992, 5 pps.
Junsheng Yu, "Amorphous silicon TFT", Display Device Technology, Aug. 31, 2014, 2 pps.
Boqiang Zhong et al., "Thin Film Transistor and Integrated Circuit", Amorphous Semiconductor Materials and Their Applications, Mar. 31, 1991, 2 pps.

\* cited by examiner

DEVICE FOR TEMPERATURE DETECTION

CROSS REFERENCE TO RELATED APPLICATIONS

This patent application is a National Stage Entry of PCT/CN2018/070036 filed on Jan. 2, 2018, which claims the benefit and priority of Chinese Patent Application No. 201710407940.6 filed on Jun. 2, 2017, the disclosures of which are incorporated herein by reference in their entirety as part of the present application.

BACKGROUND

The present disclosure relates to the field of display techniques, and particularly, to a device for temperature detection.

With the wide application of mobile products, people's demand for electronic products is increasingly growing, and display panels are also rapidly developed. The display panels are widely used in the fields such as liquid crystal display (LCD), organic light emitting diode display (OLED), electronic paper display (EPD), and micro-display. Since the liquid crystal characteristics and the OLED operation stability change with temperature, display effect changes accordingly. Therefore, understanding the temperature changes in the display panels can help offset the adverse effect caused by the temperature changes.

BRIEF DESCRIPTION

The embodiments of the present disclosure provide a device for temperature detection.

One aspect of the present disclosure provides a device for temperature detection, including a delay unit including an odd number of inverters coupled end to end, a switching transistor having a control electrode coupled to an output end of the delay unit, a first electrode coupled to an operating voltage node of the device, and a second electrode coupled to an input end of the delay unit, a first capacitor having a first end coupled to the input end of the delay unit, and a second end coupled to the first electrode of the switching transistor or a ground node of the device, and a temperature sensitive transistor having a control electrode coupled to a bias voltage end of the device, a first electrode coupled to the input end of the delay unit, and a second electrode coupled to the ground node of the device, wherein, an active area of a transistor of at least one of the inverters includes a semiconductor material having an electron mobility between $0.1\ cm^2V^{-1}s^{-1}$ and $20\ cm^2V^{-1}s^{-1}$.

In one embodiment, the semiconductor material includes amorphous silicon or oxide semiconductor.

In one embodiment, the oxide semiconductor includes at least one of ZnSnO, InZnO, SnO2, InSnO, InGaO and InGaZnO, or a combination thereof.

In one embodiment, an active area of at least one of the switching transistor and the temperature sensitive transistor includes polycrystalline silicon.

In one embodiment, the polycrystalline silicon is low temperature polycrystalline silicon.

In one embodiment, the transistor in the inverter, the switching transistor and the temperature sensitive transistor are thin film transistors.

In one embodiment, the at least one of the inverters includes a first thin film transistor and a second thin film transistor, and wherein a first electrode and a control electrode of the first thin film transistor are coupled to the operating voltage node of the device, a second electrode of the first thin film transistor is coupled to an output end of the inverter, a first electrode of the second thin film transistor is coupled to the output end, a control electrode of the second thin film transistor is coupled to an input end of the inverter, and a second electrode of the second thin film transistor is coupled to the ground node of the device.

In one embodiment, the at least one of the inverters further includes a second capacitor, wherein a first end of the second capacitor coupled to the first electrode of the second thin film transistor, and a second end of the second capacitor coupled to the ground node of the device.

In one embodiment, both the first thin film transistor and the second thin film transistor are N-channel field effect transistors.

Further aspects and scopes of applicability will become apparent from the description provided herein. It should be understood that various aspects of this application may be implemented individually or in combination with one or more other aspects. It should also be understood that the description and specific embodiments herein are only intended for the purposes of illustration rather than limiting the scope of this application.

BRIEF DESCRIPTION OF THE DRAWINGS

The drawings described herein are only for illustrative purpose of selected embodiments rather than any possible implementation, and they are not intended to limit the scope of this application, in which.

DETAILED DESCRIPTION

Firstly, it should be noted that unless additionally and explicitly pointed out in the context, the singular form of a term used herein and used in the appended claims includes the plural form, and vice versa. Thus, when a term is mentioned in the singular form, it usually includes the plural form. Similarly, the words "include" and "comprise" will be interpreted as inclusive rather than exclusive. Where the term "example" is used herein, particularly following a group of terms, it is merely exemplary and illustrative and should not be considered as exclusive or extensive. The terms "first", "second", "third" and the like are just used for description, and should not be understood as indicating or implying any relative importance or formation sequence.

Now the exemplary embodiments will be described more completely with reference to the drawings.

Figure 1:
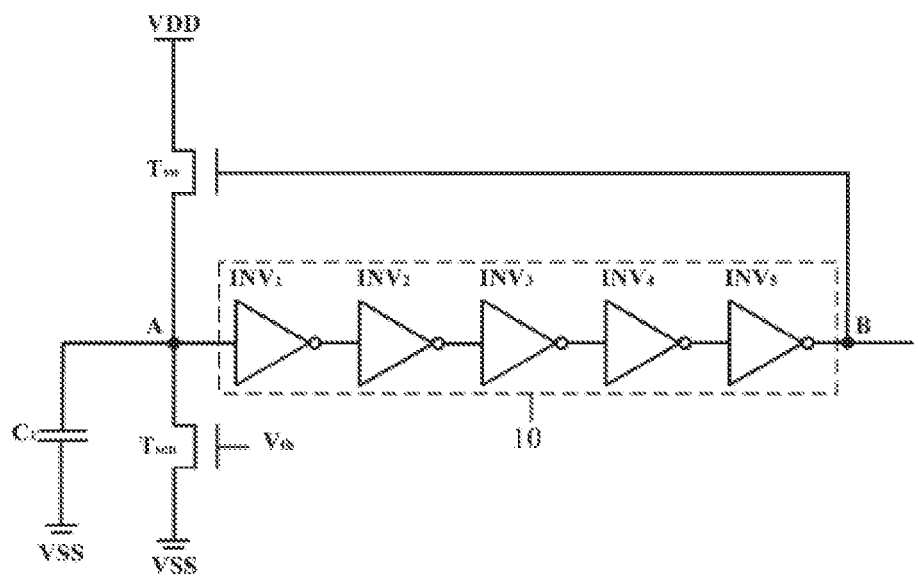
FIG. 1 illustrates a schematic diagram of a device for temperature detection according to an embodiment of the present disclosure.

FIG. 1 illustrates a schematic diagram of a device for temperature detection according to an embodiment of the present disclosure. The device includes a delay unit 10, a switching transistor $T_{sw}$, a temperature sensitive transistor $T_{sen}$, and a first capacitor $C_1$. The delay unit 10 may include an odd number (for example, five) of inverters $INV_1$ to $INV_5$ coupled end to end. In addition, it should be understood that herein the term "couple" includes direct and indirect connections between elements.

As illustrated in FIG. 1, a control electrode of the switching transistor $T_{sw}$ is coupled to an output end B of the delay unit 10, a first electrode of the switching transistor $T_{sw}$ is coupled to an operating voltage node VDD of the device, and a second electrode of the switching transistor $T_{sw}$ is coupled to an input end A of the delay unit 10. A first end of the first capacitor $C_1$ is coupled to the input end A of the delay unit 10, and a second end of the first capacitor $C_1$ is coupled to a ground node VSS of the device. A control electrode of the temperature sensitive transistor $T_{sen}$ is coupled to a bias voltage end $V_{th}$ of the device, a first electrode of the temperature sensitive transistor $T_{sen}$ is coupled to the input end A of the delay unit 10, and a second electrode of the temperature sensitive transistor $T_{sen}$ is coupled to the ground node VSS of the device. The switching transistor $T_{sw}$, the first capacitor $C_1$, and the temperature sensitive transistor $T_{sen}$ are used to cooperate with the delay unit 10 to generate a periodic oscillation waveform, which will be later described in detail with reference to FIG. 3.

According to the embodiment of the present disclosure, the control electrode of the temperature sensitive transistor $T_{sen}$ is coupled to the bias voltage end $V_{th}$, wherein a voltage at the bias voltage end may be a subthreshold bias voltage, under which the channel of the temperature sensitive transistor $T_{sen}$ is in a weak inversion state, channel current is in a monotonically increasing relationship with temperature, and the channel current is less than the normal bias current.

According to one embodiment of the present disclosure, an active area of each transistor of the inverters $INV_1$ to $INV_5$ of the delay unit 10 may include a semiconductor material having an electron mobility between 0.1 $cm^2V^{-1}s^{-1}$ and 20 $cm^2V^{-1}s^{-1}$, such as amorphous silicon or oxide semiconductor. Specifically, the oxide semiconductor may include at least one of ZnSnO, InZnO, $SnO_2$, InSnO, InGaO, and InGaZnO, or a combination thereof. Since the mobility of the amorphous silicon or the oxide semiconductor is low, the delay time of the inverters $INV_1$ to $INV_5$ of the delay unit 10 is increased. It should be understood that the semiconductor material of the active area of the transistor of the inverters $INV_1$ to $INV_5$ of the delay unit 10 is not limited thereto, as long as the semiconductor material of the active area of the transistor of the inverters $INV_1$ to $INV_5$ of the delay unit 10 has an electron mobility between 0.1 $cm^2V^{-1}s^{-1}$ and 20 $cm^2V^{-1}s^{-1}$.

To be noted, those skilled in the art can understand that the delay time of the delay unit 10 may be increased as long as the active area of the transistor of at least one of the inverters $INV_1$ to $INV_5$ of the delay unit 10 includes a semiconductor material having an electron mobility between 0.1 $cm^2V^{-1}s^{-1}$ and 20 $cm^2V^{-1}s^{-1}$. When the semiconductor material is used for the active area of the transistor of each of the inverters $INV_1$ to $INV_5$ of the delay unit 10, the sum of the delay time of the five inverters $INV_1$ to $INV_5$ may be further increased, thereby further increasing the delay time of the delay unit 10.

According to the embodiment of the present disclosure, both the switching transistor $T_{sw}$ and the temperature sensitive transistor $T_{sen}$ may be thin film transistors, the thin film transistors may employ N-channel or P-channel Metal Oxide Semiconductor Field Effect Transistors (MOSFETs).

According to the embodiment of the present disclosure, the active area of at least one of the switching transistor $T_{sw}$ and the temperature sensitive transistor $T_{sen}$ may include a polycrystalline silicon semiconductor material such as low-temperature polycrystalline silicon. However, the semiconductor material of the active areas of the switching transistor $T_{sw}$ and the temperature sensitive transistor $T_{sen}$ is not limited thereto, and any other conventional semiconductor material in the art may also be employed.

Figure 2:
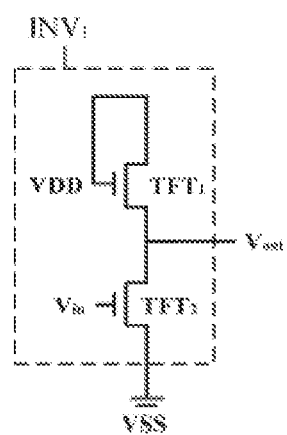
FIG. 2 illustrates a schematic diagram of an inverter of a delay unit of a device for temperature detection according to an embodiment of the present disclosure.

FIG. 2 illustrates a schematic diagram of an inverter $INV_1$ of a delay unit 10 of a device for temperature detection according to an embodiment of the present disclosure. The inverter $INV_1$ includes a first thin film transistor $TFT_1$ and a second thin film transistor $TFT_2$. A first electrode and a control electrode of the first thin film transistor $TFT_1$ are coupled to an operating voltage node VDD of the device, and a second electrode of the first thin film transistor $TFT_1$ is coupled to an output end $V_{out}$ of the inverter $INV_1$. A first electrode of the second thin film transistor $TFT_2$ is coupled to the output end $V_{out}$, a control electrode of the second thin film transistor $TFT_2$ is coupled to an input end $V_{in}$ of the inverter $INV_1$, and a second electrode of the second thin film transistor $TFT_2$ is coupled to a ground node VSS of the device. Similarly, the inverters $INV_2$ to $INV_5$ can employ the same configuration as the inverter $INV_1$, which will not be repeated herein.

Since the output voltage of the inverter is high (or low) when the input voltage of the inverter is low (or high), the five inverters $INV_1$ to $INV_5$ of the delay unit 10 coupled end to end change the phase of the input signal and introduce a transmission delay.

According to one embodiment of the present disclosure, both the first thin film transistor $TFT_1$ and the second thin film transistor $TFT_2$ may employ N-channel Metal Oxide Semiconductor Field Effect Transistors (MOSFETs). Correspondingly, the first electrode of the first thin film transistor $TFT_1$ and the first electrode of the second thin film transistor $TFT_2$ are drain electrodes, the second electrode of the first thin film transistor $TFT_1$ and the second electrode of the second thin film transistor $TFT_2$ are source electrodes, and the control electrode of the first thin film transistor $TFT_1$ and the control electrode of the second thin film transistor $TFT_2$ are gate electrodes.

According to one embodiment of the present disclosure, the active areas of the first thin film transistor $TFT_1$ and the second thin film transistor $TFT_2$ may include a semiconductor material having an electron mobility between 0.1 $cm^2V^{-1}s^{-1}$ and 20 $cm^2V^{-1}s^{-1}$, such as amorphous silicon or oxide semiconductor. The oxide semiconductor may include at least one of ZnSnO, InZnO, $SnO_2$, InSnO, InGaO, and InGaZnO, or a combination thereof. As the mobility of the semiconductor material is low, the delay time of the inverter is increased.

Figure 3:
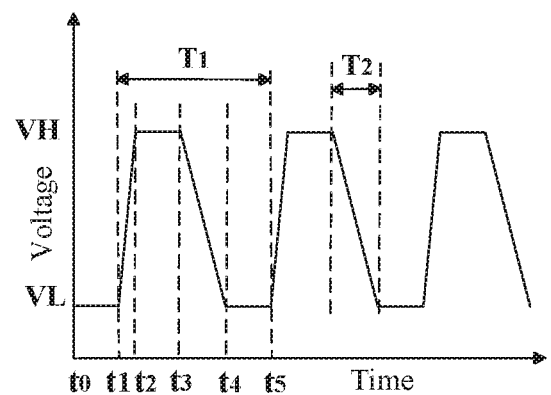
FIG. 3 illustrates a schematic diagram of a waveform generated by a device for temperature detection in FIG. 1 according to an embodiment of the present disclosure.

FIG. 3 illustrates a schematic diagram of a waveform generated by the device for temperature detection in FIG. 1 according to an embodiment of the present disclosure. As illustrated in FIG. 3, at initial timing $t_0$, an operating voltage VDD is applied to the first electrode of the switching transistor $T_{sw}$, and a voltage VA at the input end A of the delay unit 10 is a low voltage VL (e.g., a low voltage close to 0 V); at that time, the switching transistor $T_{sw}$ is turned off, and the first capacitor $C_1$ is not charged. After this state lasts for a period of time, at timing $t_1$, the low voltage VL at the input end A is transmitted to the output end B of the delay unit 10 (wherein a time interval between $t_0$ and $t_1$ is corresponding to a sum of the delay time of the five inverters $INV_1$ to $INV_5$ of the delay unit 10). Since there are an odd number of inverters, the voltage at the output end B is a high voltage VH. The high voltage VH acts on the control electrode of the switching transistor $T_{sw}$ to turn on the switching transistor $T_{sw}$.

Since the switching transistor $T_{sw}$ is turned on, at timing $t_2$, the voltage VA at the input end A is quickly pulled from the low voltage VL to the high voltage VH. At that time, a voltage difference is generated across the first capacitor $C_1$, so that the first capacitor $C_1$ starts to be charged. After a period of time, at timing $t_3$, the high voltage VH at the input end A is transmitted to the output end B of the delay unit 10 (wherein a time interval between $t_2$ and $t_3$ is corresponding to a sum of the delay time of the five inverters $INV_1$ to $INV_5$ of the delay unit 10). Since there are an odd number of inverters, the voltage at the output end B is the low voltage VL. The low voltage VL acts on the control electrode of the switching transistor $T_{sw}$ to turn off the switching transistor $T_{sw}$. At that time, the first capacitor $C_1$ has completed charging.

Since the switching transistor $T_{sw}$ is turned off, the high voltage VH at the input end A is released through the temperature sensitive transistor $T_{sen}$ so that the voltage VA at the input end A is gradually decreased. As the voltage VA at the input end A is gradually decreased, the first capacitor $C_1$ is caused to discharge to neutralize the charges accumulated on the two plates. At timing $t_4$, the voltage VA at the input end A is decreased from the high voltage VH to the low voltage VL. After this state lasts for a period of time, at timing $t_5$, the low voltage VL at the input end A is transmitted to the output end B of the delay unit 10 (wherein a time interval between $t_4$ and $t_5$ is corresponding to a sum of the delay time of the five inverters $INV_1$ to $INV_5$ of the delay unit 10). Since there are an odd number of inverters, the voltage at the output end B is a high voltage VH. The high voltage VH acts on the control electrode of the switching transistor $T_{sw}$ to turn on the switching transistor $T_{sw}$. A voltage difference is generated across the first capacitor $C_1$, so that the first capacitor $C_1$ starts to be charged. Next, the same process is repeated to produce the oscillation waveform as illustrated in FIG. 3. A period $T_1$ of the oscillation waveform is a time interval between the timing $t_1$ and $t_5$, and a discharge time $T_2$ is a time interval between the timing $t_3$ and $t_4$. It should be noted that the oscillation waveform as illustrated in FIG. 3 is a voltage waveform at the input end A, and a voltage waveform at the output end B can be obtained by taking an inverted signal of the voltage waveform at the input end A.

As described above, when the temperature sensitive transistor $T_{sen}$ is in a subthreshold bias state, the discharge current is small, so the discharge time $T_2$ between the timing $t_3$ and $t_4$ is long. Since the subthreshold current of the temperature sensitive transistor $T_{sen}$ is in a monotonically increasing relationship with temperature, when the temperature rises, the discharge current flowing through the temperature sensitive transistor $T_{sen}$ is increased, and the discharge time $T_2$ is shortened, so that the period $T_1$ of the output waveform detected by the device is shortened and the frequency is increased, while when the temperature drops, the discharge current flowing through the temperature sensitive transistor $T_{sen}$ is decreased, and the discharge time $T_2$ prolonged, so that the period $T_1$ of the output waveform detected by the device becomes long and the frequency is decreased. Thus, a one-to-one correspondence and monotonically decreasing relationship is established between the period of the output waveform of the device and the temperature, i.e., the frequency of the output waveform of the device is in a monotonically increasing relationship with the temperature. Therefore, the temperature can be represented by detecting the period or frequency of the voltage waveform at the output end B of the device.

Figure 4A:
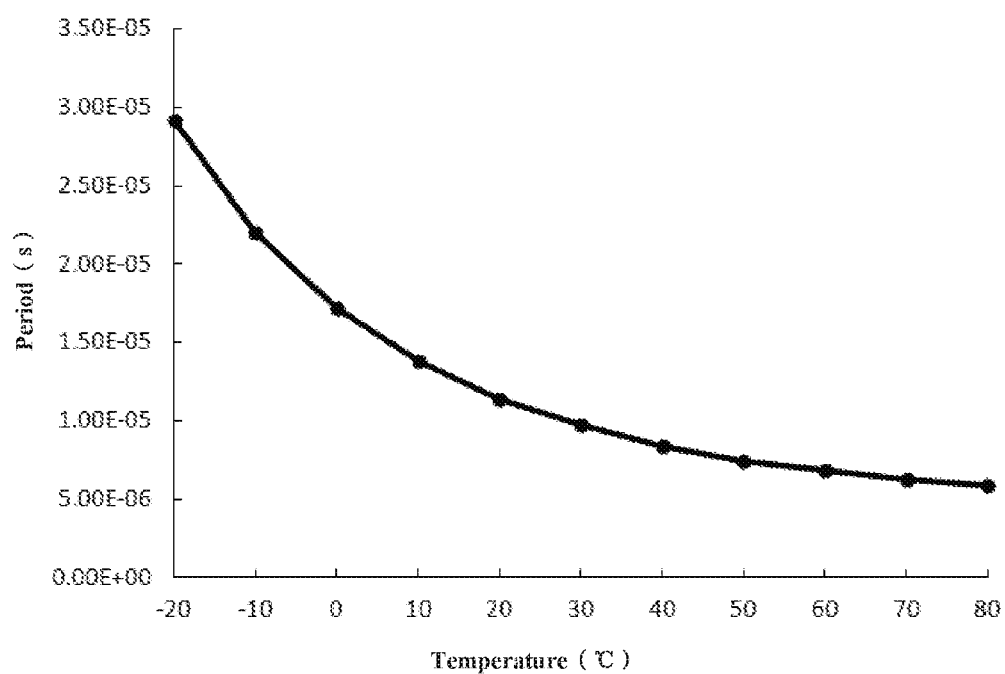
FIGS. 4A and 4B illustrate temperature characteristic curves of a device for temperature detection according to an embodiment of the present disclosure.
Figure 4B:
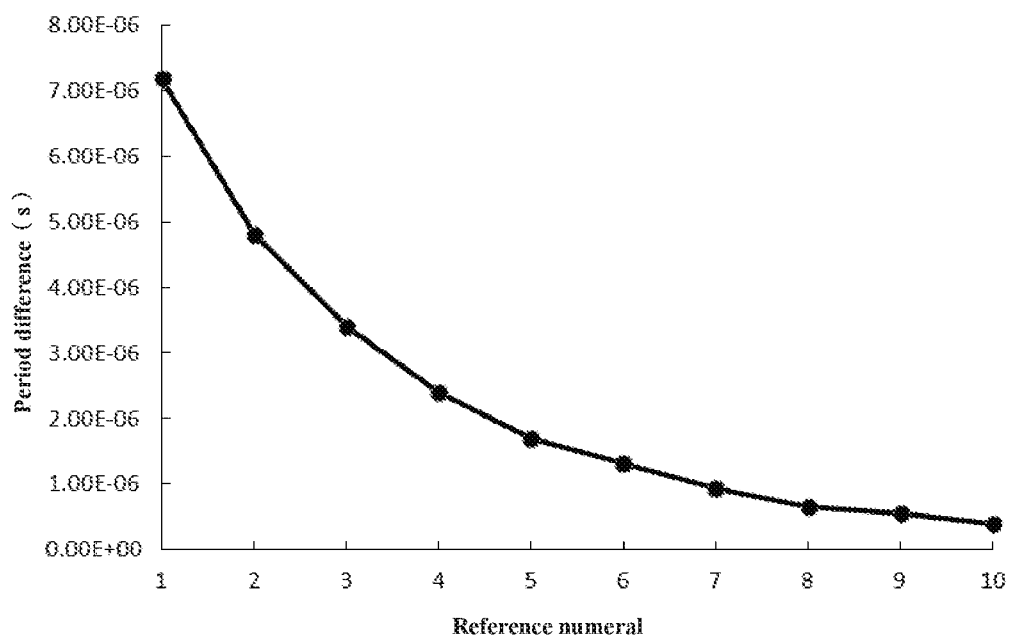

FIGS. 4A and 4B illustrate temperature characteristic curves of a device for temperature detection according to an embodiment of the present disclosure. In this exemplary embodiment, the device for temperature detection is the device as illustrated in FIG. 1. The active areas of the first thin film transistor $TFT_1$ and the second thin film transistor $TFT_2$ of each of the inverters $INV_1$ to $INV_5$ of the delay unit 10 are made of amorphous silicon, and the amorphous silicon has an electron mobility between 0.1 $cm^2V^{-1}s^{-1}$ and 20 $cm^2V^{-1}s^{-1}$. The active areas of the switching transistor $T_{sw}$ and the temperature sensitive transistor $T_{sen}$ are made of low temperature polycrystalline silicon. In the curve as illustrated in FIG. 4A, the vertical axis represents the period of the voltage waveform at the output end B of the device, and the horizontal axis represents the temperature. The points on the curve represent the periods corresponding to the temperatures from $-20°$ C. to $80°$ C., respectively. As illustrated in FIG. 4A, the period of the output waveform of the device is decreased with the increase of the temperature, and they are in a monotonically decreasing relationship. The curve as illustrated in FIG. 4B is a differential curve of the curve as illustrated in FIG. 4A. The points on the curve of FIG. 4B can be respectively described as follows: reference numeral 1 represents a case that a difference value between a period at $-20°$ C. and a period at $-10°$ C. on the curve of FIG. 4A, and accordingly, value on y-axis is the corresponding difference value. And so on, the reference numeral 10 represents a case that a difference value between a period at $70°$ C. and a period at $80°$ C. on the curve of FIG. 4A, and accordingly, value on y-axis is the corresponding difference value.

Figure 5A:
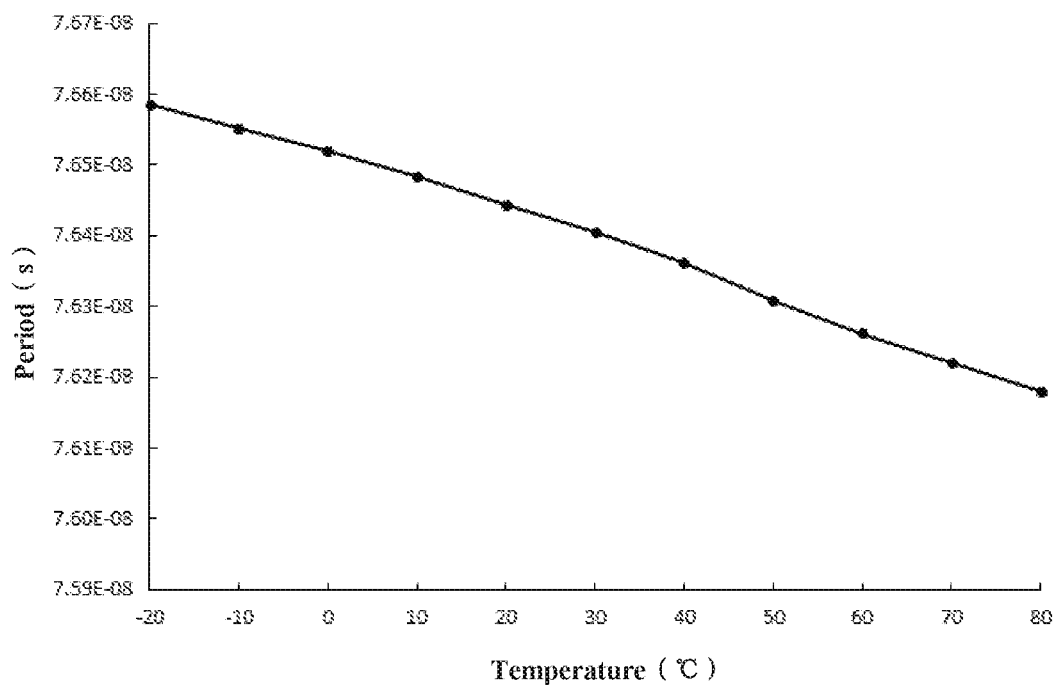
FIGS. 5A and 5B illustrate temperature characteristic curves of a device for temperature detection according to a comparative embodiment of the present disclosure.
Figure 5B:
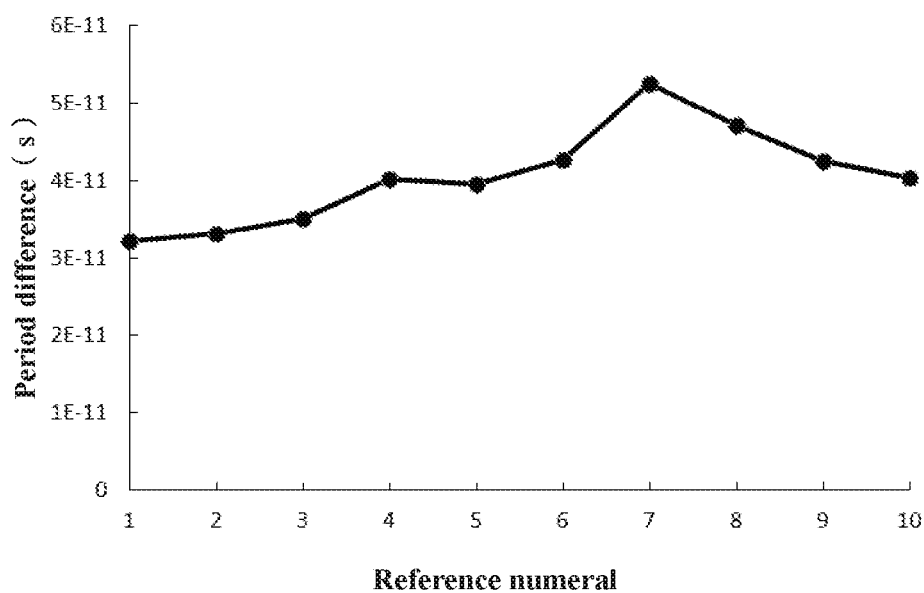

FIGS. 5A and 5B illustrate temperature characteristic curves of a device for temperature detection according to a comparative embodiment of the present disclosure. In this exemplary embodiment, the device for temperature detection is the device as illustrated in FIG. 1. The active areas of the first thin film transistor $TFT_1$ and the second thin film transistor $TFT_2$ of each of the inverters $INV_1$ to $INV_5$ of the delay unit 10 are made of polycrystalline silicon, and the active areas of the switching transistor $T_{sw}$ and the temperature sensitive transistor $T_{sen}$ are made of low temperature polycrystalline silicon. The temperature characteristic curves of FIGS. 5A and 5B have the meanings similar to those of FIGS. 4A and 4B, and the description thereof will not be repeated herein.

As can be seen from the comparison between FIGS. 4A and 5A, FIG. 4A has a longer period than FIG. 5A under the same temperature. That is to say, when the active area of the transistor of the inverter of the delay unit of the device is made of amorphous silicon, the delay time of the inverter can be increased, thereby increasing the period of the device used in FIG. 4. As can be seen from the comparison between FIGS. 4B and 5B, the period change of the device in FIG. 4B caused by the temperature change is very large, and it is five orders of magnitude higher than the period change in FIG. 5B. That is to say, when the active area of the transistor of the inverter of the delay unit of the device is made of amorphous silicon, the sensitivity of the device can be improved to distinguish the period change caused by the temperature change. This is because the amorphous silicon usually contains a large number of dangling bonds, and the electron mobility is very low. When the active area of the transistor of the inverter of the delay unit is made of amorphous silicon, the delay time of the inverter is increased, thereby increasing the period of the device and improving the sensitivity. Those skilled in the art can understand that the sensitivity of the device can be improved as long as the active area of the transistor of at least one of the inverters $INV_1$ to $INV_5$ of the delay unit 10 is made of amorphous silicon. Only when the active area of the transistor of each of the inverters $INV_1$ to $INV_5$ is made of amorphous silicon, the sum of the delay time of the five inverters $INV_1$ to $INV_5$ can be further increased, thereby further increasing the period and sensitivity of the device. Similarly, when the active area of the transistor of the inverter is made of an oxide semiconductor, the period and sensitivity of the device can also be increased in the same principle as that of amorphous silicon, and the description thereof will not be repeated herein.

Thus, as can be seen from the above description, the active area of the transistor of the inverter of the device for temperature detection in this embodiment includes a semiconductor material having an electron mobility between 0.1 $cm^2V^{-1}s^{-1}$ and 20 $cm^2V^{-1}s^{-1}$, thus, the lower mobility increases the delay time of the inverter, thereby increasing the sensitivity of the device for temperature detection so as to distinguish the period change caused by the temperature change. The device can be integrated in the display panel to better detect the temperature change within the screen.

Figure 6:
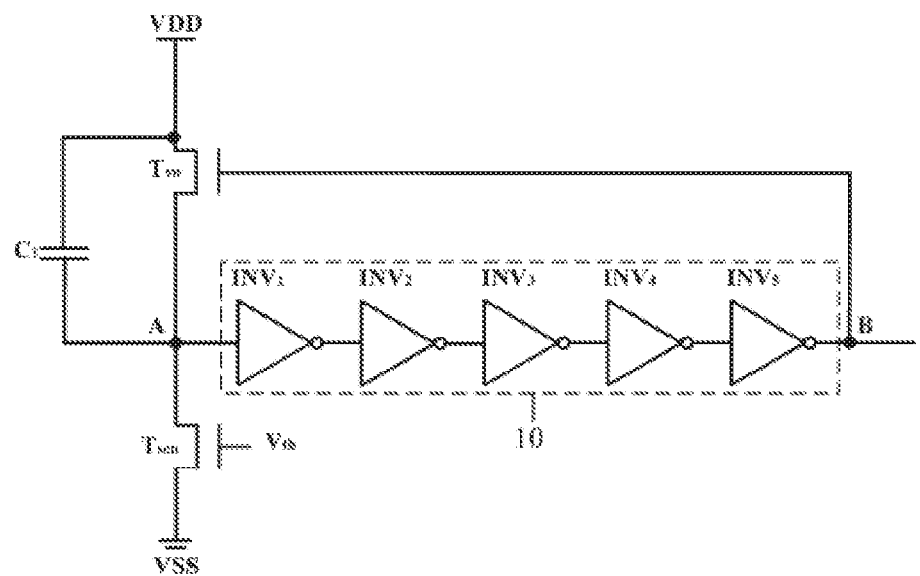
FIG. 6 illustrates a schematic diagram of a device for temperature detection according to another embodiment of the present disclosure.

FIG. 6 illustrates a schematic diagram of a device for temperature detection according to another embodiment of the present disclosure. The device for temperature detection in FIG. 6 is substantially the same as that in FIG. 1, except that the second end of the first capacitor C1 is coupled to the operating voltage node VDD of the device. Similarly, a one-to-one corresponding and monotonically decreasing relationship is established between the period of the output waveform of the device and the temperature, i.e., the frequency of the output waveform is in a monotonically increasing relationship with the temperature. Thus, the temperature can be represented by detecting the period or frequency of the voltage waveform at the output end B of the device.

Figure 7:
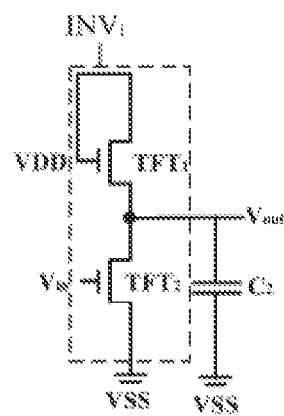
FIG. 7 illustrates a schematic diagram of an inverter of a delay unit of a device for temperature detection according to another embodiment of the present disclosure.

FIG. 7 illustrates a schematic diagram of an inverter of a delay unit of a device for temperature detection according to another embodiment of the present disclosure. The inverter $INV_1$ in FIG. 7 is substantially the same as that in FIG. 2, except that the inverter $INV_1$ further includes a second capacitor $C_2$, wherein a first end of the second capacitor $C_2$ is coupled to a first electrode of the second thin film transistor $TFT_2$ (i.e., coupled to an output end $V_{out}$ of the inverter $INV_1$), and a second end of the second capacitor $C_2$ is coupled to a ground node of the device. When the inverter $INV_1$ including the second capacitor $C_2$ is applied to the delay unit 10 in FIG. 1, the period $T_1$ of the output waveform of the output end of the device is adjusted by adjusting a value of the second capacitor $C_2$. Thus, the second capacitor $C_2$ can be appropriately adjusted to further increase the period $T_1$ of the output waveform and improve the sensitivity of the device. Similarly, the inverters $INV_2$ to $INV_5$ can also adopt the same configuration as the inverter $INV_1$, and the description thereof will not be repeated herein.

It should be noted that the device for temperature detection of the present disclosure is not limited to the examples described above. Firstly, the number of the inverters of the delay unit is not limited to five, as long as there are an odd number of inverters coupled end to end. Secondly, the delay unit is not limited to the odd number of inverters coupled end to end as illustrated in FIG. 1, and may also include a delay unit composed of other components.

The foregoing descriptions of the embodiments have been provided for purpose of illustration and description. It is not intended to be exhaustive or to limit the application. Individual elements or features of a particular embodiment are generally not limited to that particular embodiment, but, where applicable, these elements or features are interchangeable and can be used in a selected embodiment, even if not specifically shown or described. The same may also be varied in many ways. Such variations are not to be regarded as a departure from the application, and all such variations are included within the scope of the application.

What is claimed is:

1. A device for temperature detection comprising:
a delay unit including an odd number of inverters coupled end to end in cascade;
a switching transistor having a gate electrode coupled to an output end of the delay unit, a first source/drain electrode coupled to an operating voltage node of the device, and a second source/drain electrode coupled to an input end of the delay unit;
a first capacitor having a first end coupled to the input end of the delay unit, and a second end coupled to the first source/drain electrode of the switching transistor; and
a temperature sensitive transistor having a gate electrode coupled to a bias voltage end of the device, a first source/drain electrode coupled to the input end of the delay unit, and a second source/drain electrode coupled to the ground node of the device, wherein, an active area of a transistor of at least one of the inverters comprises a semiconductor material having an electron mobility between 0.1 $cm^2V^{-1}s^{-1}$ and 20 $cm^2V^{-1}s^{-1}$, wherein the at least one of the inverters comprises a first thin film transistor and a second thin film transistor, and wherein a first source/drain electrode and a gate electrode of the first thin film transistor are coupled to the operating voltage node of the device, a second source/drain electrode of the first thin film transistor is coupled to an output end of the inverter, a first source/drain electrode of the second thin film transistor is coupled to the output end, a gate electrode of the second thin film transistor is coupled to an input end of the inverter, and a second source/drain electrode of the second thin film transistor is coupled to the ground node of the device.

2. The device according to claim 1, wherein the semiconductor material comprises one of amorphous silicon and oxide semiconductor.

3. The device according to claim 2, wherein the oxide semiconductor comprises at least one of ZnSnO, InZnO, SnO2, InSnO, InGaO, and InGaZnO, or a combination thereof.

4. The device according to claim 3, wherein the transistor in the inverter, the switching transistor, and the temperature sensitive transistor are thin film transistors.

5. The device according to claim 1, wherein an active area of at least one of the switching transistor and the temperature sensitive transistor comprises polycrystalline silicon.

6. The device according to claim 2, wherein the transistor in the inverter, the switching transistor, and the temperature sensitive transistor are thin film transistors.

7. The device according to claim 5, wherein the polycrystalline silicon is low temperature polycrystalline silicon.

8. The device according to claim 5, wherein the transistor in the inverter, the switching transistor, and the temperature sensitive transistor are thin film transistors.

9. The device according to claim 7, wherein the transistor in the inverter, the switching transistor, and the temperature sensitive transistor are thin film transistors.

10. The device according to claim 1, wherein the transistor in the inverter, the switching transistor, and the temperature sensitive transistor are thin film transistors.

11. The device according to claim 1, wherein the at least one of the inverters further comprises a second capacitor, wherein a first end of the second capacitor is coupled to the first source/drain electrode of the second thin film transistor, and wherein a second end of the second capacitor is coupled to the ground node of the device.

12. The device according to claim 1, wherein both the first thin film transistor and the second thin film transistor are N-channel field effect transistors.

\* \* \* \* \*